United States Patent [19]

Kobayashi

[11] Patent Number: 4,852,036

[45] Date of Patent: Jul. 25, 1989

[54] ADAPTIVE DIGITAL FILTER AND AN ECHO CANCELER INCORPORATING THE SAME

[75] Inventor: Masaki Kobayashi, Tokyo, Japan

[73] Assignee: Oki Electric Industry Co., Ltd., Tokyo, Japan

[21] Appl. No.: 114,873

[22] Filed: Oct. 30, 1987

[30] Foreign Application Priority Data

Jan. 7, 1987 [JP] Japan ............................. 62-000542
Jan. 7, 1987 [JP] Japan ............................. 62-000543
Jan. 7, 1987 [JP] Japan ............................. 62-000544

[51] Int. Cl.$^4$ ........................................... H04B 3/23
[52] U.S. Cl. .............................. 364/724.19; 379/410
[58] Field of Search ............. 333/18; 364/724, 724.01, 364/724.19; 370/32.1; 375/14; 379/410, 411

[56] References Cited

FOREIGN PATENT DOCUMENTS 206223 12/1983 Japan .
141814 8/1984 Japan .
0264825 11/1986 Japan ................................. 370/32.1

OTHER PUBLICATIONS

"Computer Aided Design and Analysis of Standard IIR Architectures—Part II", IEEE Circuits and Systems Magazine, vol. 4, No. 1, Mar. 1982, pp. 4–10.

1985 Symposium on Information Systems of the Institute of Electronics and Communication Engineers of Japan, No. 366, pp. 2–107, "A Synthesis Method of Adaptive Digital Filters," Itoh et al.

Measurement and Control, vol. 7, No. 9; Sep. 1978, pp. 597–601, "A Learning Method for System Identification", Noda et al.

*Primary Examiner*—Steven Mottola
*Attorney, Agent, or Firm*—Spencer & Frank

[57] ABSTRACT

In an adaptive digital filter, the inputs to the variable-coefficient scalers of an adaptive digital filter are mutually orthogonal and their mean square values are equal. As a result, the rate of convergence of the variable coefficients of the variable-coefficient scalers is rapid. The adaptive filter is suitable for use in echo cancelers. In addition, means are provided to make the rate of convergence high even when the input signal is non-white.

6 Claims, 9 Drawing Sheets

ADAPTIVE DIGITAL FILTER AND AN ECHO CANCELER INCORPORATING THE SAME

BACKGROUND OF THE INVENTION

This invention relates to an adaptive digital filter capable of generating an arbitrary transfer function. In particular, it relates to an adaptive digital filter having a fast rate of convergence, suitable for use in a device such as an echo canceler. The invention also relates to an echo canceler incorporating such an adaptive digital filter.

Recent rapid progress in digital signal-processing technology has created great interest in adaptive digital filters due to their wide range of applications. Typical of these applications is system identification, which is a process of estimating an unknown system characteristic from input and output data.

Means for the identification of an unknown system by use of an adaptive digital filter are shown in schematic form in FIG. 1. These means comprise a signal input terminal 11, an error output terminal 12, an unknown system 13, an adaptive digital filter (ADF) 14, and an adder 15. In the figure, x(k) is the input to the unknown system 13 and the adaptive digital filter 14 at time k, y(k) is the output from the unknown system 13 at time k, $\hat{y}$(k) is the output from the adaptive digital filter 14 at time k, e(k) is the estimation error at time k, H(z) is the transfer function of the unknown system, and $\hat{H}$(z) is the transfer function of the adaptive digital filter 14. In the configuration shown, if the evaluation function is J=e(k)$^2$, then when J=0 the adaptive digital filter 14 is regarded as correctly estimating the characteristic of the unknown system 13.

A specific type of device using an adaptive digital filter like the one described above is an echo canceler. Echo cancelers are used, for example, in teleconferencing systems, for which there has been a recently growing demand. FIG. 2 is a schematic diagram of a teleconferencing system employing an echo canceler. This system comprises a pair of microphones 21-1 and 21-2, a pair of loudspeakers 22-1 and 22-2, a pair of echo cancelers 23-1 and 23-2, which respectively include adaptive digital filters 25-1 and 25-2, and a pair of transmission lines 24-1 and 24-2, and has a pair of acoustically coupled paths 26-1 and 26-2, In most teleconferencing systems the loudspeaker and microphone shown in FIG. 2 are integrated into a single unit called a voice terminal. This gives rise to an acoustic coupling between the loudspeaker and the microphone: the signal output from the loudspeaker is coupled into the microphone and greatly degrades the quality of the voice transmission. In FIG. 2 there are acoustic coupling paths, labeled 26-1, and 26-2, between the loudspeaker 22-1 and the microphone 21-1, and between the loudspeaker 22-2 and the microphone 21-2, but the echo cancelers 23-1 and 23-2 act to eliminate the signal coupled from the loudspeaker into the microphone.

The inventor has presented adaptive digital filters suitable for use in such an echo canceler in Japanese patent application Nos. 164770/1986 and 163677/1986 and a corresponding U.S. patent application Ser. No. 070,773, filed July 7, 1987. FIG. 3 shows the first of these adaptive digital filters. This adaptive digital filter comprises M basic sections connected in series (where M is a positive integer). Basic sections 1 through M-1 each comprise a second-order recursive digital filter and a second-order nonrecursive digital filter. Basic section M, the final section, comprises a second-order recursive digital filter. Adjacent basic sections are connected by scalers that multiply by $Q_m$ and by $1/Q_m$ (m=1 to M). Each basic section also has a first-order nonrecursive digital filter comprising a scaler $R_m$ for multiplying the first-order delayed output $u_m$(k-1) by the coefficient $R_m$, an adder 31 for adding the result to the 0th-order delayed output $u_m$(k), a scaler $S_m$ for multiplying the output of the adder $31_m$ by the coefficient $S_m$, a variable-coefficient scaler $c_m$(k) for multiplying the result $\bar{u}_m$(k) by a variable coefficient $c_m$(k), a variable-coefficient scaler $d_m$(k) for multiplying the first-order delayed output $u_m$(k-1) by a variable coefficient $d_m$(k), and an adder $32_m$ for adding the outputs of the two variable-coefficient scalers $c_m$(k) and $d_m$(k). The outputs from the adders $32_m$ are added one after the other and the output from the adder $33_M$ is the output y(k) of the filter with respect to the input x(k).

The coefficients $Q_m$ of the scalers $Q_m$ (m=1 to M) are chosen so that the mean square values of the first-order delayed outputs $u_m(m-1)$ (m=1 to M) are equal to the mean square value of the input signal x(k) (a white-noise signal). The coefficients $S_m$ of the scalers $S_m$ (m=1 to M) are chosen so that the means square values of their outputs $\bar{u}_m$(k) (m=1 to M) are equal to the mean square value of the input signal x(k). The coefficients $R_m$ of the scalers $R_m$ (m=1 to M) are chosen so that when x(k) is a white-noise signal, the signals $\hat{u}_m$(k-1) (m=1 to M) are orthogonal. These selections increase the rate of convergence of the variable coefficients $c_m$(k) and $d_m$(k) (also called the adaptive parameters) of the variable-coefficient scalers.

The adaptive digital filter shown in FIG. 3 displays excellent convergence characteristics when the input signal x(k) is a white-noise signal. When the input signal has nonwhite characteristics, as in a voice signal, however, $u_m$(k-1) and $\hat{u}_m$(k) are not orthogonal, and their mean square values are unequal, so the convergence characteristics of the variable coefficients (adaptive parameters) $c_m$(k) and $d_m$(k) are degraded.

SUMMARY OF THE INVENTION

An object of this invention is to solve the above problem and provide an adaptive digital filter system that can estimate unknown system characteristics correctly by using an adaptive digital filter in which convergence of the variable coefficients (adaptive parameters) is rapid even when the input signal is nonwhite.

According to a first aspect of the invention there is provided an adaptive digital filter comprising M basic sections (where M is a positive integer) connected in series, in which each of the first M−1 basic sections comprises a second-order recursive digital filter and a second-order noncyclic digital filter and the M-th basic section comprises a second-order recursive digital filter.

The m-th basic section (m=1 to M) comprises a scaler for multiplying the first-order delayed output $g_m$(k) of the basic section by a coefficient $R_m$, a first adder for adding the output of this scaler to the 0th-order delayed output signal, a first variable-coefficient scaler for multiplying the output $v_m$(k) of the first adder by a variable coefficient $C_m$(k), a second variable-coefficient scaler for multiplying the first-order delayed output $g_m$(k) by a variable coefficient $D_m$(k), and a second adder for adding the output of the first variable-coefficient scaler to the output of the second variable-coefficient scaler. The outputs of the second adders of each of the basic sections are added to create the final output signal of the filter.

The coefficients $a_m$ and $b_m$ of the second-order recursive digital filter in each basic section are selected so that the poles of this filter are located near the unit circle in the z-plane. The variable coefficients $C_m(k)$ and $D_m(k)$ are selected so that the mean square value of the first-order delayed output $g_m(k)$ and the mean square value of the output $v_m(k)$ of the first adder are equal.

In the above configuration, the filter input signal is fed to the first (m=1) basic section. This signal passes through the second-order recursive digital filter and the second-order nonrecursive digital filter to become the input of the next (m=2) basic section. In the first (m=1) section, the first-order delayed output $g_1(k)$ is multiplied by a coefficient $R_1$ and added to the 0th-order delayed output in the first adder. The output $v_1(k)$ of the first adder is multiplied by a variable coefficient $C_1(k)$ and output to the second adder. The first-order delayed output $g_1(k)$ is also multiplied by a variable coefficient $D_1(k)$ and output to the second adder. The second adder adds these two inputs and outputs their sum. This process is repeated in each of the basic sections through the final (M-th) section. The filter output $y(k)$ is obtained from the second adder of the final (M-th) section.

In this operation, because the coefficients $a_m$ and $b_m$ and the variable coefficients $C_m(k)$ and $D_m(k)$ are selected as described above, the variable coefficients $C_m(k)$ and $D_m(k)$ converge rapidly even when the input signal is a nonwhite signal such as a voice signal.

According to a second aspect of the invention, each basic section comprises, in place of the elements listed above, a scaler for multiplying the 0th-order delayed output $v_m(k)$ (M=1 to M) of the basic section by a coefficient $R_m$, a first adder for adding the output of this scaler to the first-order delayed output signal, a first variable-coefficient scaler for multiplying the output $g_m(k)$ of the first adder by a variable coefficient $D_m(k)$, a second variable-coefficient scaler for multiplying the 0th-order delayed output $v_m(k)$ by a variable coefficient $C_m(k)$, and a second adder for adding the output of the first variable-coefficient scaler to the output of the second variable-coefficient scaler. The outputs of the second adders of each of the basic sections are added to create the final output signal of the filter. The values of $a_m$, $b_m$, $C_m(k)$, and $D_m(k)$ are selected as described earlier.

In the above configuration, the filter input signal is fed to the first (m=1) basic section. This signal passes through the second-order recursive digital filter and the second-order nonrecursive digital filter to become the input of the next (m=2) basic section. In the first (m=1) section, the 0th-order delayed output $v_1(k)$ is multiplied by a coefficient $R_1$ and added to the first-order delayed output in the first adder. The output $g_1(k)$ of this first adder is multiplied by a variable coefficient $D_1(k)$ and output to the second adder. The 0th-order delayed output $v_1(k)$ is also multiplied by a variable coefficient $C_1(k)$ and output to the second adder. The second adder adds these two inputs and outputs their sum. This process is repeated in each of the basic sections through the final (M-th) section. The filter output $y(k)$ is obtained from the second adder of the final (M-th) section In this operation, because the coefficients $a_m$ and $b_m$ and the variable coefficients $C_m(k)$ and $D_m(k)$ are selected as described above, the variable coefficients $C_m(k)$ and $D_m(k)$ converge rapidly even when the input signal is a nonwhite signal such as a voice signal.

According to a third aspect of the invention, there is provided an adaptive digital filter comprising M second-order recursive digital filter connected in parallel (where M is a positive integer).

Each second-order recursive digital filter in the adaptive digital filter comprises a scaler for multiplying the first-order delayed output $g_m(k)$ of the second-order recursive digital filter by coefficient $R_m$ (m=1 to M), a first adder for adding the output of this scaler to the 0th-order delayed output signal, a first variable-coefficients scaler for multiplying the output $v_m(k)$ of the first adder by a variable coefficient $C_m(k)$, a second variable-coefficients scaler for multiplying the first-order delayed output $g_m(k)$ by a variable coefficient $D_m(k)$, and a second adder for adding the output of the first variable-coefficient scaler to the output of the second variable-coefficient scaler. The outputs of the second adders of each of the basic sections are added to created the final output signal of the filter.

The coefficients $a_m$ and $b_m$ of each second-order recursive digital filter are selected so that the poles of that filter are located near the unit circle in the z-plane. The variable coefficients $C_m(k)$ and $D_m(k)$ are selected so that the mean square value of the first-order delayed output $g_m(k)$ and the mean square value of the output $V_m(k)$ of the first adder are equal.

In the above configuration, the input signal of the adaptive digital filter is fed to each second-order recursive digital filter. This input signal is added to the difference between the first-order delayed output $g_m(k)$ (m=1 to M) multiplied by the coefficient $a_m$ (m=1 to M) and the second-order delayed output multiplied by the coefficient $b_m$ (m=1 to M). The first-order delayed output $g_m(k)$ is also multiplied by the coefficient $R_m$ (m=1 to M), and the result is added to the 0th-order delayed output in a first adder. The sum $v_m(k)$ (m=1 to M) is multiplied by a variable coefficient $C_m$ (m=1 to M), then added in a second adder to the first-order delayed output $g_m(k)$ multiplied by a variable coefficient $D_m$ (m=1 to M). The outputs of the second adders are added in succession to create the final output $y(k)$ of the filter.

In this operation, because the coefficients $a_m$ and $b_m$ and the variable coefficients $C_m(k)$ and $D_m(k)$ are selected as stated above, $g_m(k)$ and $v_m(k)$ are mutually orthogonal, and their mean square values are all equal. Convergence of $C_m(k)$ and $D_m(k)$ is therefore rapid even when the input signal is non-white.

According to a fourth aspect of the invention, each second-order recursive digital filter comprises a scaler for multiplying the 0th-order delayed output $v_m(k)$ (m=1 to M) of this second-order recursive digital filter by a coefficient $R_m$, a first adder for adding the output of this scaler to the first-order delayed output signal, a first variable-coefficient scaler for multiplying the output $g_m(k)$ of the first adder by a variable coefficient $D_m(k)$, a second variable-coefficient scaler for multiplying the 0th-order delayed output $v_m(k)$ by a variable coefficient $C_m(k)$, and a second adder for adding the output of the first variable-coefficient scaler to the output of the second variable-coefficient scaler. The outputs of the second adders of each of the basic sections are added to create the final output signal of the filter.

The values of $a_m$, $b_m$, $C_m(k)$, and $D_m(k)$ are selected in the same way as described in connection with the third aspect of the invention.

In the above configuration of this invention described above, the input signal of the adaptive digital filter is fed to each of the second-order recursive digital filters. This input signal is added to the sum of the first-order delayed output $g_m(k)$ (m=1 to M) multiplied by a coefficient $a_m$ (m=1 to M) and the second-order delayed output multiplied by a coefficient $b_m$ (m=1 to M). The 0th-order delayed output $v_m(k)$ is also multiplied by a coefficient $R_m$ (m=1 to M), and the result is added to the first-order delayed output in a first adder. The sum $g_m(k)$ (m=1 to M) is multiplied by a variable coefficient $D_m$ (m=1 to M), then added in a second adder to the 0th-order delayed output $v_m(k)$ multiplied by a variable coefficient $C_m$ (m=1 to M). The outputs of the second adders are added in succession to create the final output $y(k)$ of the filter.

In the above configuration, for the same reason as described in connection with the third aspect of the invention, convergence of $C_m(k)$ and $D_m(k)$ is rapid even when the input signal is non-white.

According to a fifth aspect of the invention, there is provided an echo canceler in which the output from an unknown system is connected to a recursive digital filter, the output of an adaptive digital filter that estimates the output of the unknown system is subtracted from the output of the recursive digital filter, the difference signal is fed to a nonrecursive digital filter having a transfer function inverse to the transfer function of the recursive digital filter, and the output of the nonrecursive digital filter is the output of the echo canceler.

The adaptive digital filter in this echo canceler may comprise any of those described in connection with the first through fourth aspects of the invention.

In the above configuration, the output from the unknown system passes through the recursive digital filter. The output of the adaptive digital filter above is subtracted from the output of this recursive filter. The difference signal is passed through a nonrecursive digital filter having a transfer function inverse to that of the recursive filter, and the output of this filter is the output of the each canceler.

Because of such a configuration, the system output estimates the unknown system correctly even when R in the denominator $1 \pm Rz^{-2M}$ of the adaptive digital filter in equation (15) given below cannot be ignored.

DETAILED DESCRIPTION OF THE PREFERRED EMBODIMENTS

Figure 3:
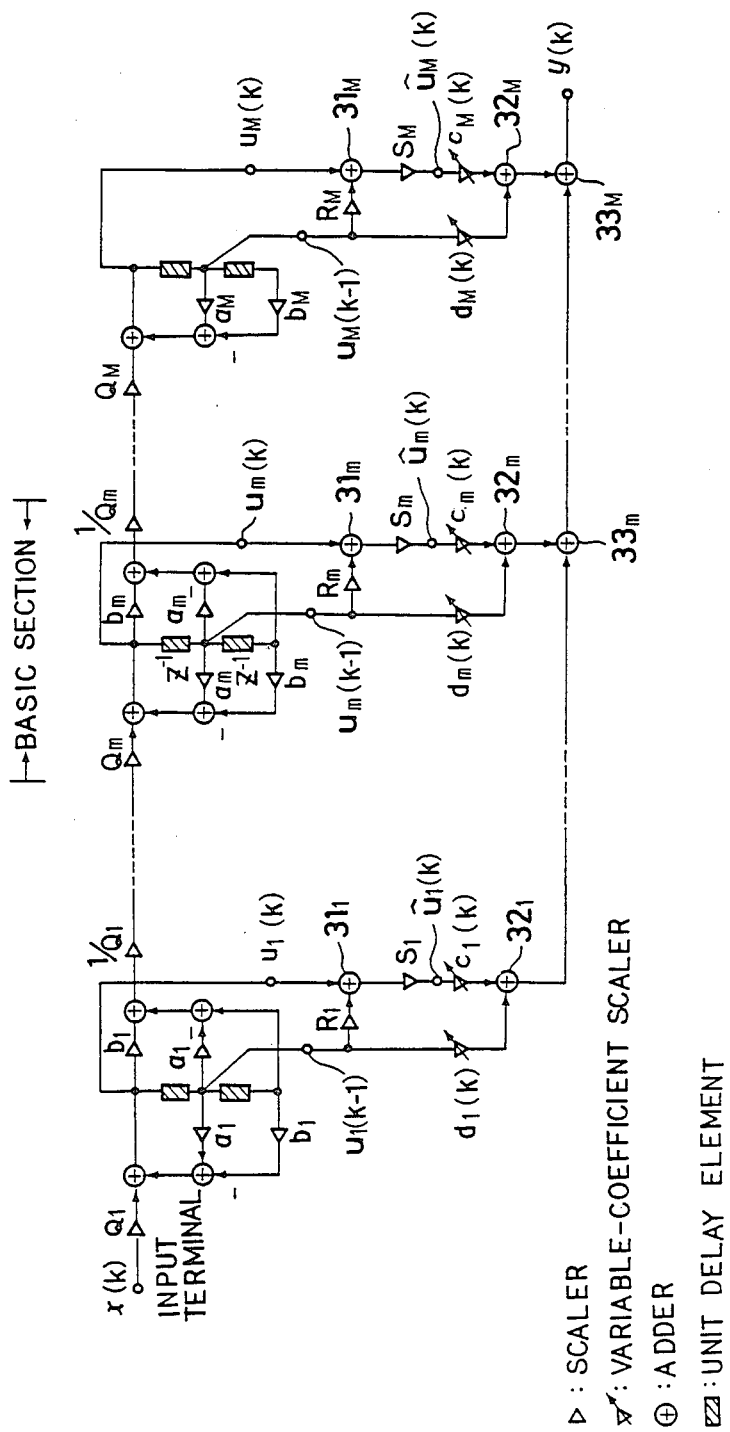
FIG. 3 shows a configuration of an adaptive digital filter that has been proposed by the inventor.

The invention is featured by the selection of the scaler coefficients $a_m$ and $b_m$ (m=1 to M) in the adaptive digital filter in FIG. 3 so that $\hat{u}_m(k)$ and $u_m(k-1)$ (m=1 to M) are approximately orthogonal, and by the selection of the variable scaler coefficients by which these are multiplied so that the mean square values (power value) of $\hat{u}_m(k)$ and $u_m(k-1)$ are all equal. Before description of the embodiments of this invention in detail, description of its basic principles will be given.

Figure 4:
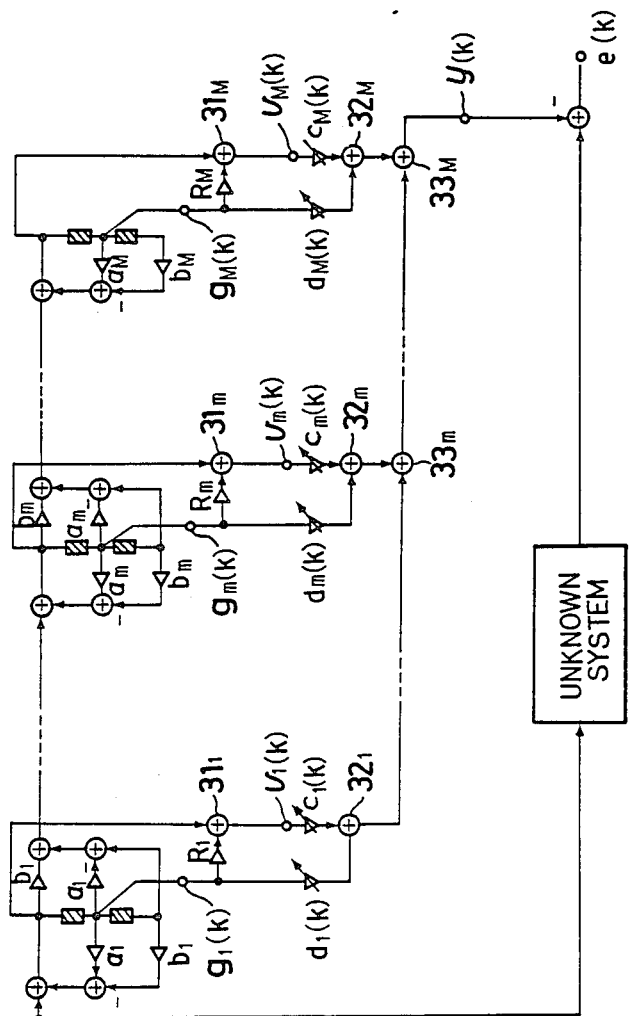
FIG. 4 shows the adaptive digital filter of FIG. 3 without scalers to explain the selection of coefficients $a_m$ and $b_m$.

First, a description of the selection of the scaler coefficients $a_m$ and $b_m$ (m=1 to M) will be given. FIG. 4 shows the adaptive digital filter of FIG. 3 without the scaler $Q_m$ having the coefficient $Q_m$ (m=1 to M), the scaler $1/Q_m$ having the coefficient $1/Q_m$ (m=1 to M), and the scaler $S_m$ having the coefficient $S_m$. Assume that the input signal $x(k)$ has a white characteristic, and that a circuit with a transfer function $F(z)$ (where z is the complex variable) converts this to a signal with a nonwhite characteristic, which is input to the adaptive digital filter. Let $g_m(k)$ be the output of the first-order delay element in the m-th basic section (m=1 to M), let $v_m(k)$ be the sum of $g_m(k)$ multiplied by the coefficient $R_m$ (m=1 to M) and the 0th-order delayed output, and let $G_m(z)$ and $V_m(z)$ be the z-transforms of $g_m(k)$ and $v_m(k)$. Then:

$$G_m(z) = \frac{\prod\limits_{i=1}^{m-1}(b_i - a_i z^{-1} + z^{-2}) \cdot z^{-1}}{\prod\limits_{i=1}^{m}(1 - a_i z^{-1} + b_i z^{-2})}$$

$$V_n(z) = \frac{(1 + R_n z^{-1})\prod\limits_{i=1}^{n-1}(b_i - a_i z^{-1} + z^{-2})}{\prod\limits_{i=1}^{n}(1 - a_i z^{-1} + b_i z^{-2})} \quad (1)$$

The time average of $g_m(k)$ and $v_m(k)$ is calculated as follows, where $E[.]$ is the time-averaging operator:

$$E[g_m(k) \cdot v_n(k)] = \quad (2)$$

$$\frac{1}{2\pi j}\oint G_m(z) \cdot V_n(z^{-1}) \cdot |F(z)|^2 z^{-1} dz =$$

$$\frac{1}{2\pi j}\oint z^{-1} \frac{\prod\limits_{i=1}^{m-1}(b_i - a_i z^{-1} + z^{-2})}{\prod\limits_{i=1}^{m}(1 - a_i z^{-1} + b_i z^{-2})} \cdot$$

$$\frac{(1 + R_n z)\prod\limits_{i=1}^{n-1}(b_i - a_i z + z^2)}{\prod\limits_{i=1}^{n}(1 - a_i z + b_i z^2)} |F(z)|^2 z^{-1} dz =$$

$$\frac{1}{2\pi j}\oint z \frac{\prod\limits_{i=1}^{m-1}(b_i z^2 - a_i z + 1)}{\prod\limits_{i=1}^{m}(z^2 - a_i z + b_i)} \cdot$$

-continued $$\frac{(1+R_nz)\prod_{i=1}^{n-1}(b_i-a_iz+z^2)}{\prod_{i=1}^{n}(1-a_iz+b_iz^2)}|F(z)|^2 z^{-1} dz =$$

$$\frac{1}{2\pi j}\oint z\frac{(1+R_nz)\prod_{i=n+1}^{m-1}(b_iz^2-a_iz+1)}{\prod_{i=n}^{m}(z^2-a_iz+b_i)}|F(z)|^2 z^{-1} dz =$$

$$\frac{1}{2\pi j}\oint\frac{|F(z)|^2}{(z^2-a_nz+b_n)(z^2-a_mz+b_m)} \cdot$$

$$\frac{\prod_{i=n+1}^{m-1}(b_iz^2-a_iz+1)}{\prod_{i=n+1}^{m-1}(z^2-a_iz+b_i)}\cdot(1+R_nz)dz =$$

$$\frac{1}{2\pi j}\oint\frac{|F(z)|}{z^2-a_nz+b_n}\cdot\frac{|F(z)|}{z^2-a_mz+b_m} \cdot$$

$$\frac{\prod_{i=n+1}^{m-1}(b_iz^2-a_iz+1)}{\prod_{i=n+1}^{m-1}(z^2-a_iz+b_i)}\cdot(1+R_nz)dz$$

The term $$\frac{\prod_{i=n+1}^{m-1}(b_iz^2-a_iz+1)}{\prod_{i=n+1}^{m-1}(z^2-a_iz+b_i)}$$

in Eq. (2) describes an all-pass filter circuit. If $f_n(z)=z^2-a_nz+b_n$ and $f_m(z)=z^2-a_mz+b_m$, and $a_n$, $a_m$, $b_n$, and $b_m$ are selected so that the roots of $f_n(z)$ and $f_m(z)$ are located near the unit circle, in the complex plane (z plane) then:

$$\frac{|F(z)|}{z^2-a_nz+b_n}=\frac{|F(z)|}{(z-p_n)(z-\overline{p_n})}= \quad (3)$$

$$\frac{|F(z)|}{\overline{p_n}-p_n}\cdot\left(\frac{1}{z-\overline{p_n}}-\frac{1}{z-p_n}\right)\approx$$

$$\frac{1}{p_n-p_n}\left\{\frac{|F(\overline{p_n})|}{z-\overline{p_n}}-\frac{|F(p_n)|}{z-p_n}\right\}=$$

$$\frac{1}{\overline{p_n}-p_n}\left\{\frac{z|F(\overline{p_n})|-\overline{p_n}|F(\overline{p_n})|-z|F(p_n)|+\overline{p_n}|F(p_n)|}{(z-p_n)(z-p_n)}\right\}=$$

$$\frac{1}{\overline{p_n}-p_n}\cdot\frac{|F(p_n)|(\overline{p_n}-p_n)}{(z-\overline{p_n})(z-p_n)}=\frac{|F(p_n)|}{z_2-a_nz+b_n}$$

$$(\because|F(\overline{p_n})|=|\overline{F(p_n)}|=|F(p_n)|)$$

and similarly:

$$\frac{|F(z)|}{z^2-a_mz+b_m}\approx\frac{|F(p_m)|}{z^2-a_mz+b_m} \quad (4)$$

where an overbar indicates the complex conjugate.
From equations (2) to (4) it follows that:

$$E[g_m(k)\cdot v_n(k)]\approx \quad (5)$$

$$\frac{1}{2\pi j}|F(p_n)||F(p_m)|\oint\frac{1}{z^2-a_nz+b_n}\cdot\frac{1}{z^2-a_mz+b_m}\cdot$$

$$\frac{\prod_{i=n+1}^{m-1}(z^2-a_iz+b_i)}{\prod_{i=n+1}^{m-1}(z^2-a_iz+b_i)}(1+R_nz)dz$$

Since the integrand in Eq. (5) matches the case of $|F(z)|=1$, which is the case of white noise input to the adaptive digital filter, the contour integral is zero. Therefore:

$$E[g_m(k)\cdot v_n(k)]\tau 0 \quad (6)$$

The other orthogonality conditions are also approximately satisfied; that is, $E[g_m(k) v_m(k)]$, $E[g_m(k) g_n(k)]$, and $E[v_m(k) v_n(k)]$ can be shown to be approximately zero. Thus if the poles of the second-order recursive digital filter are near the unit circle in the z-plane, $u_m(k)$ and $u_m(k-1)$ are approximately orthogonal even when the input signal is nonwhite.

The method of updating the variable coefficients (adaptive parameters) so that the mean square values of all the $\hat{u}_m(k)$ and $u_m(k-1)$ are equal will be described next. As noted above, when the input to the adaptive digital filter is a white-noise signal the mean square values of the input signals to $c_m(k)$ and $d_m(k)$ are equal, but when the signal is nonwhite, these values are unequal. The method described below, however, makes the mean square values of the input signals to $c_m(k)$ and $d_m(k)$ equal even for a nonwhite signal.

Figure 5:
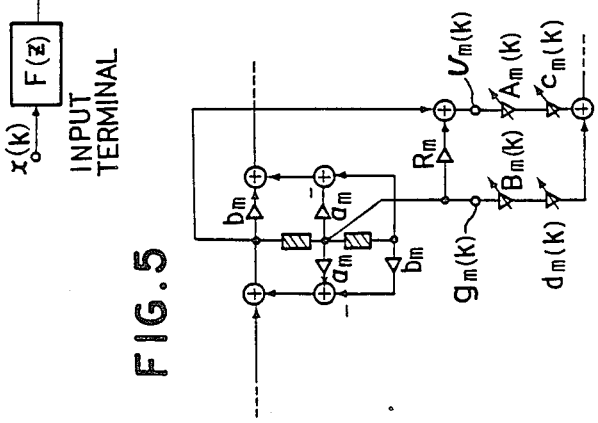
FIG. 5 shows the m-th basic section in FIG. 3 to explain equalization of mean square vales of $g_m(k)$ and $v_m(k)$.

FIG. 5 shows the m-th basic section (m=1 to M−1) in FIG. 3 modified by the addition of a variable-coefficient scaler $A_m(k)$ with variable coefficient $A_m(k)$ and a variable-coefficient scaler $B_m(k)$ with variable coefficient $B_m(k)$. (Similar modifications are also made to the M-th basic section.) The purpose of the variable scaler coefficients $A_m(k)$ and $B_m(k)$ is to equalize the mean square values of the input signals to the scaler $c_m(k)$ with variable scaler coefficient $c_m(k)$ and the scaler $d_m(k)$ with variable scaler coefficient $d_m(k)$. $A_m(k)$ and $B_m(k)$ are accordingly selected as follows:

$$A_m(k)=\frac{1}{\sqrt{\frac{1}{N+1}\sum_{j=0}^{N}v_m^2(k-j)}} \quad (7)$$

$$B_m(k)=\frac{1}{\sqrt{\frac{1}{N+1}\sum_{j=0}^{N}g_m^2(k-j)}}$$

If the well-known learning identification algorithm is used for updating the values of $c_m(k)$ and $d_m(k)$, then:

$$c_m(k+1) = c_m(k) + \quad (8)$$

$$\frac{\alpha e(k) \cdot A_m(k) \cdot v_m(k)}{\sum_{m=1}^{M} [\{A_m^2(k) \cdot v_m^2(k)\} + \{B_m^2(k) \cdot g_m^2(k)\}]}$$

α: Loop gain (constant)

Combining the scalers $A_m(k)$ and $C_m(k)$ so that $C_m(k) = A_m(k) c_m(k)$, Eq. (8) becomes:

$$C_m(k+1) = C_m(k) + \quad (9)$$

$$\frac{\alpha e(k) \cdot A_m^2(k) \cdot v_m(k)}{\sum_{m=1}^{M} [\{A_m^2(k) \cdot v_m^2(k)\} + \{B_m^2(k) \cdot g_m^2(k)\}]}$$

Let:

$$\xi_m(k) = \sum_{j=0}^{N} V_m^2(k-j), \phi_m(k) = \sum_{j=0}^{N} g_m^2(k-j) \quad (10)$$

Then from Eqs. (7) and (9):

$$C_m(k+1) = C_m(k) + \frac{\alpha e(k) \cdot \frac{V_m(k)}{\xi_m(k)}}{\sum_{m=1}^{M} \left( \frac{v_m^2(k)}{\xi_m(k)} + \frac{g_m^2(k)}{\phi_m(k)} \right)} \quad (11)$$

Similarly:

$$d_m(k+1) = d_m(k) + \quad (12)$$

$$\frac{\alpha e(k) \cdot B_m(k) \cdot g_m(k)}{\sum_{m=1}^{M} [\{A_m^2(k) \cdot v_m^2(k)\} + \{B_m^2(k) \cdot g_m^2(k)\}]}$$

If we set $D_m(k) = B_m(k) d_m(k)$, then from Eqs. (10) and (12):

$$D_m(k+1) = D_m(k) + \frac{\alpha \cdot e(k) \cdot \frac{g_m(k)}{\phi_m(k)}}{\sum_{m=1}^{M} \left( \frac{V_m^2(k)}{\xi_m(k)} + \frac{g_m^2(k)}{\phi_m(k)} \right)} \quad (13)$$

As explained above, if $f_m(z) = z^2 - a_m z + b_m$ and $a_m$ and $b_m$ are selected so that the roots (poles) of $f_m(z)$ are located near the unit circle, and the variable scaler coefficients $C_m$ and $D_m$ are updated by Eqs. (11) and (13), the signals $g_m(k)$ and $v_m(k)$ will be nearly orthogonal and their mean square values will all be equal; therefore the rate of convergence of the adaptive parameters will be extremely fast.

Figure 6:
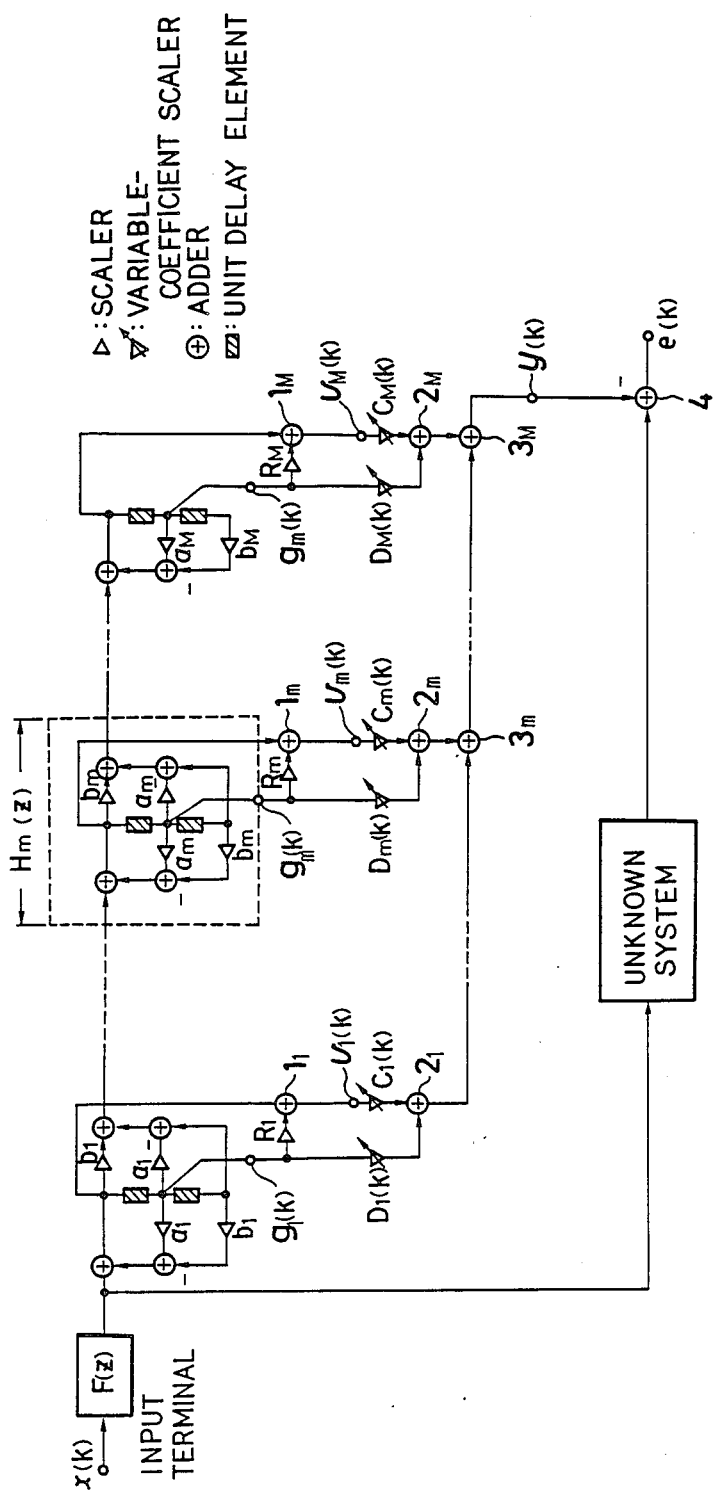
FIG. 6 shows in combination the configuration of FIGS. 4 and 5.

FIGS. 4 and 5 are shown in combined form in FIG. 6.

Figure 7:
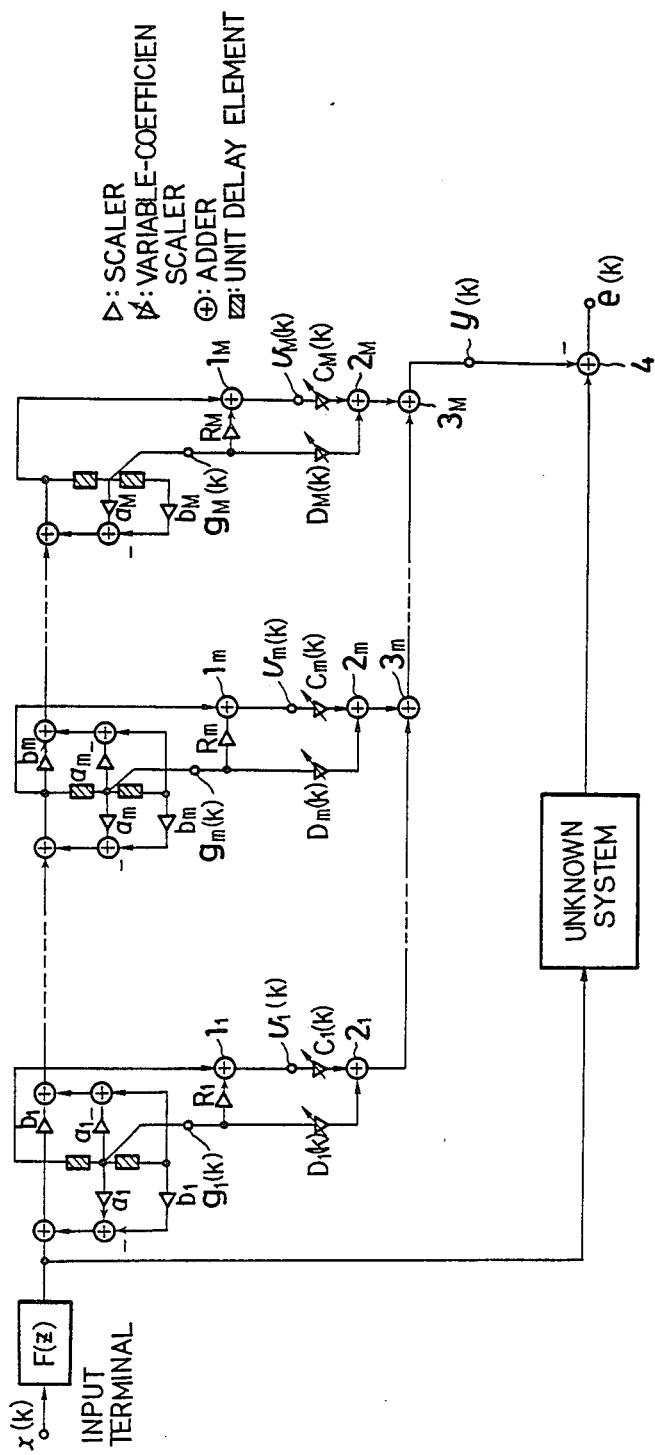
FIGS. 7 to 10 show adaptive digital filters of different embodiments of the invention.

FIG. 7 shows a first embodiment of this invention based on the principles above. The adaptive digital filter used in this embodiment comprises M basic sections connected in series (where M is a positive integer). The first M−1 basic sections (from 1 to M−1) each comprise a second-order recursive digital filter and a second-order nonrecursive digital filter. The final basic section (M) comprises a second-order recursive digital filter. The output of the second-order nonrecursive digital filter is connected to the input of the second-order recursive digital filter in the next section. In addition, the m-th basic section (m=1 to M) comprises a scaler $R_m$ for multiplying the first-order delayed output $g_m(k)$ by a scaler coefficient $R_m$, a first adder $1_m$ for adding the output of the scaler $R_m$ to the 0th-order delayed output signal, a first variable-coefficient scaler $C_m(k)$ for multiplying the ouput $v_m(k)$ of the first adder $1_m$ by a variable scaler coefficient $C_m(k)$, a second variable-coefficients scale $D_m(k)$ for multiplying the first-order delayed output $g_m(k)$ by a variable coefficient $D_m(k)$, and a second adder $2_m$ for adding the output of the first variable-coefficient scaler to the output of the second variable-coefficient scaler. An adder $3_{m+1}$ adds the output of the second adder $2_m$ to the output of the second adder $2_{m+1}$ in the next section, and this process continues through the adder $3_M$, from which is obtained the final output $y(k)$ of the filter.

The scaler coefficients $a_m$ and $b_m$ are selected as described above. Specifically, they are determined as follows. If $a_m$ and $b_m$ are selected so that:

$$\prod_{m=1}^{M} (z^2 - a_m z + b_m) = z^{2M} \pm R \left( R = \prod_{m=1}^{M} b_m \right) \quad (14)$$

then the transfer function $H(z)$ of the adaptive digital filter in FIG. 6 will be:

$$H(z) = \frac{N(z)}{1 \pm Rz^{-2M}} \quad (15)$$

where $N(z)$ is a function of $C_m$ and $D_m$. If $R << 1$, then $H(z) \approx N(z)$, so that the unknown system can be estimated to be $N(z)$. Let $re^{j\theta k}$ be a root of $(z^{2M} \pm R)$. Since $r^{2M} e^{j2M\theta k} + R = 0$:

$$r^{2M} e^{j2M\theta k} = -R = Re^{j\pi} \cdot e^{j2\pi k} (k=0,1,2,\ldots,2M-1)$$

hence $$r = R^{1/2M}, \theta_k = \frac{\pi(1+2k)}{2M} \quad (16)$$

Similarly, since $r^{2M} e^{j2M\theta k} - R = 0$:

$$r^{2M} e^{j2M\theta k} = R = Re^{j2\pi k} (k=0, 1, 2, \ldots, 2M-1)$$

hence $$r = R^{1/2M}, \theta_k = \frac{\pi \cdot k}{M} \quad (17)$$

From Eq. (14), $$z^2 = -a_m z + b_m = (z - re^{j\theta m})(z - re^{-j\theta m}) \quad (18)$$
$$= z^2 - 2rz\cos\theta_m + r^2$$

hence $$a_m = 2r\cos\theta_m = 2R^{1/2M} \cdot \cos\theta_m, b_m = R^{1/M} = r^2 \quad (19)$$
$$(m = 0, 1, 2, \ldots, M-1)$$

with the condition that when $\theta_0 = 0$, $a_m = 0$ and $b_m = -R^{1/M}$ (the real root).

For example, suppose $R = 0.1$ and $2M = 100$. (Values of this order are required in applications such as echo cancelers). From Eqs. (16) and (17) the pole radius is $r=R^{1/2M}=0.1^{1/100}=0.9772$, which is close to the unit circle. Eqs. (16) and (17) also indicate that the poles are located at equally-spaced angles at the radius $r=R^{1/2M}$ centered around the origin of the z-plane.

The variable-coefficient scaler scalers $C_m(k)$ and $D_m(k)$ (m=1 to M) are updated according to Eqs. (11) and (13), respectively.

Next the operation of the first embodiment in FIG. 7 will be described. The output signal from F(z), which becomes the input to the first basic section, is added to the output of the second-order recursive digital filter in that section. The sum, which is the 0th-order delayed output, is multiplied by the coefficient $b_1$. The result is added to the output of the second-order nonrecursive digital filter and sent to the next section. The first-order delayed output $g_1(k)$ is multiplied by the coefficient $R_1$ and the result is added to the oth-order delayed signal. The resulting sum $v_1(k)$ is multiplied by the variable $C_1(k)$, the first-order delayed output $g_1(k)$ is multiplied by the variable coefficient $D_1(k)$, and the two products are added. The sum is added to the corresponding sum in the next section. This same processis repeated until the filter output y(k) is obtained from the final section M. The output from the unknown system is subtracted from the filter output y(k) in the adder 4 to obtain the residual difference signal (error signal) $e_k$.

In this operation, $a_m$ and $b_m$ are selected according to Eq. (19) and $C_m(k)$ and $D_m(k)$ are updated according to Eqs. (11) and (13), so when the input signal is nonwhite, the inputs $g_m(k)$ and $v_m(k)$ of the two variable-coefficient scalers are mutually orthogonal and all of their mean square values are equal.

Figure 8:
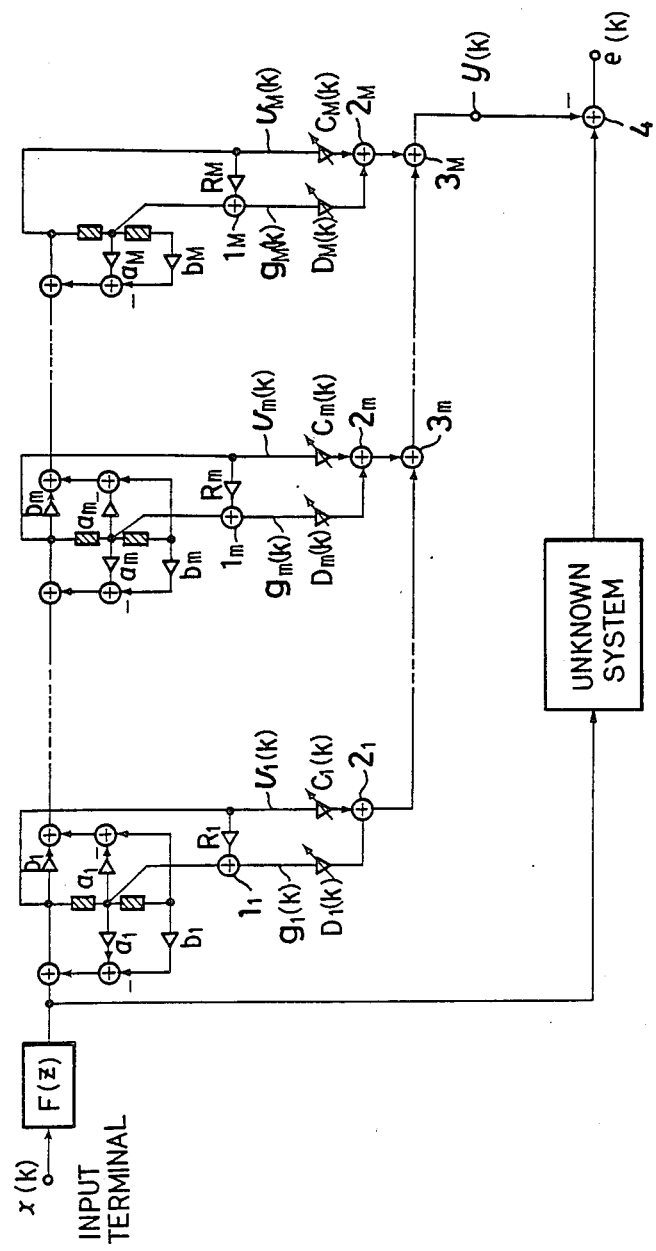

Next the operation of the second embodiment of this invention will be explained. In this embodiment, shown in FIG. 8, the scalers $R_m$(m=1 to M) are inserted in a position reverse to that in the embodiment shown in FIG. 7. That is, the 0th-order delayed output $v_m(k)$ is multiplied by the coefficient $R_m$, and added to the first-order delayed output in the adder $1_m$. The result $g_m(k)$ is multiplied by the variable coefficient $D_m(k)$. The 0th-order delayed output $v_m(k)$ is also multiplied by the variable coefficient $C_m(k)$. The two product signals are added in the adder $2_m$. Despite this difference in configuration, the adaptive digital filter of the second embodiment functions in the same way as in the first embodiment. Further explanation is therefore omitted here.

A third embodiment of the invention will be described with reference to FIG. 9. With the selection of the pole locations such that the poles are located at equally-spaced angles at the radius $r=R^{1/2M}$ centered around the origin of the z-plane as described in connection with the embodiment of FIG. 7, the transfer function $H_m(z)$ of the all-pass circuit surrounded by the dashed line in FIG. 6 is:

$$H_m(z) = \frac{b_m - a_m z^{-1} + z^{-2}}{1 - a_m z^{-1} + b_m z^{-2}} \quad (20)$$

Since $b_m = r^2 \approx 1$, it follows that:

$$H_m(z) \approx 1 \quad (21)$$

Figure 9:
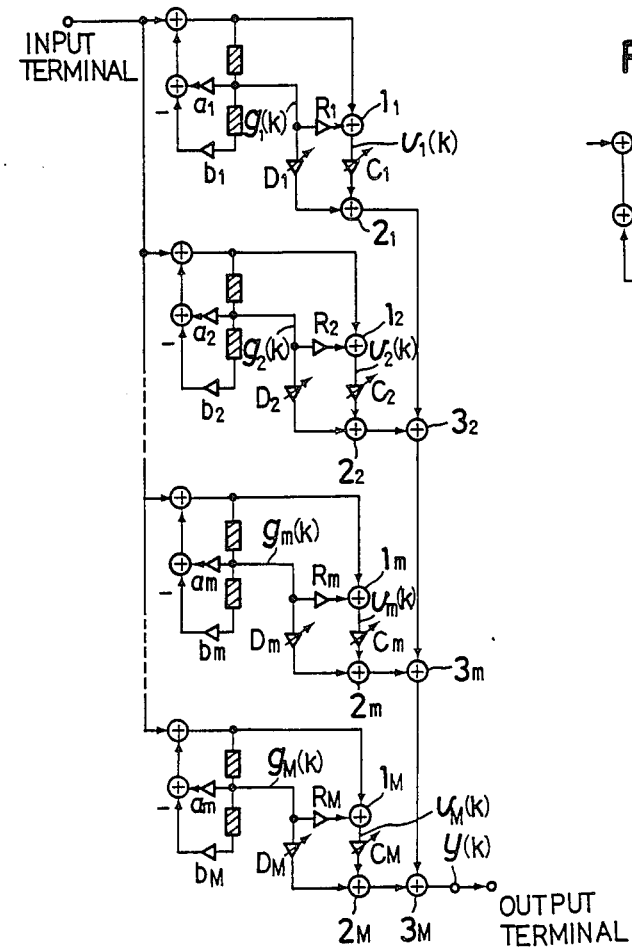

FIG. 9 shows an embodiment of the present invention based on the principle above comprising M second-order recursive digital filters connected in parallel. Each second-order recursive digital filter comprises a scaler $R_m$ for multiplying the first-order delayed output $g_m(k)$ by a coefficient $R_m$, a first adder $1_m$ for adding the output of the scaler $R_m$ to the 0th-order delayed output signal, a first variable-coefficient scaler $C_m(k)$ for multiplying the output $v_m(k)$ of the first adder $1_m$ by a variable coefficient $C_m(k)$, a second variable-coefficient scaler $D_m(k)$ for multiplying the first-order delayed output $g_m(k)$ by a variable coefficient $D_m(k)$, and a second adder $2_m$ for adding the output of the first variable-coefficient scaler to the output of the second variable-coefficient scaler. An adder $3_m$ adds the output of the second adder $2_m$ to the output of the second adder in the previous section $2_{m-1}$ (not shown in the figure). The final output of the filter is obtained from the adder $3_M$.

This embodiment operates as follows. The input signal applied to the input terminal is fed to all of the second-order recursive digital filters. This input is added to the value of the first-order delayed output $g_m(k)$ multiplied by the coefficient $a_m$ minus the value of the second-order delayed output multiplied by the coefficient $b_m$. The first-order delayed output $g_m(k)$ is also multiplied by the coefficient $R_m$ and added to the 0th-order delayed output in the adder $1_m$. The output $v_m(k)$ of this adder $1_m$ is multiplied by the variable coefficient $C_m$. The first-order delayed output $g_m(k)$ is also multiplied by the variable coefficient $D_m$. The two product signals are added in the adder $2_m$, and the sum is output to the adder $3_m$. The adder $3_m$ adds the output of the adder $2_m$ to the corresponding output in the preceding section and feeds the result to the corresponding adder $3_{m+1}$ in the next section. The final output of the filter is obtained from the adder $3_M$.

In the above operation, $a_m$ and $b_m$(m=1 to M) are selected so that the input signals to the variable-coefficient scaler $C_m(k)$ and $D_m(k)$ are approximately orthogonal, and their mean square values ae all equalized by the variable-coefficient scaler $C_m(k)$ and $D_m(k)$.

Figure 10:
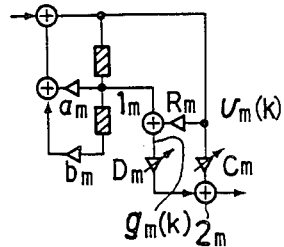

FIG. 10 shows one basic section of another embodiment of the present invention. In this embodiment, the scalers $R_m$(m=1 to M) are inserted in positions reverse to those in the embodiment shown in FIG. 9. That is, the 0th-order delayed output $v_m(k)$ is multiplied by the coefficient $R_m$, then added to the first-order delayed output in the adder $1_m$. The result $g_m(k)$ is multiplied by the variable coefficient $D_m$. The 0th-order delayed output $v_m(k)$ is also multiplied by the variable coefficient $C_m(k)$. The two product signals are added in the adder $2_m$, and the result is added to the corresponding output from the preceding section. The other parts of the embodiment in FIG. 10 function in the same way as in the embodiment of FIG. 9 and produce the same result. Further explanation is therefore omitted here.

Figure 11:
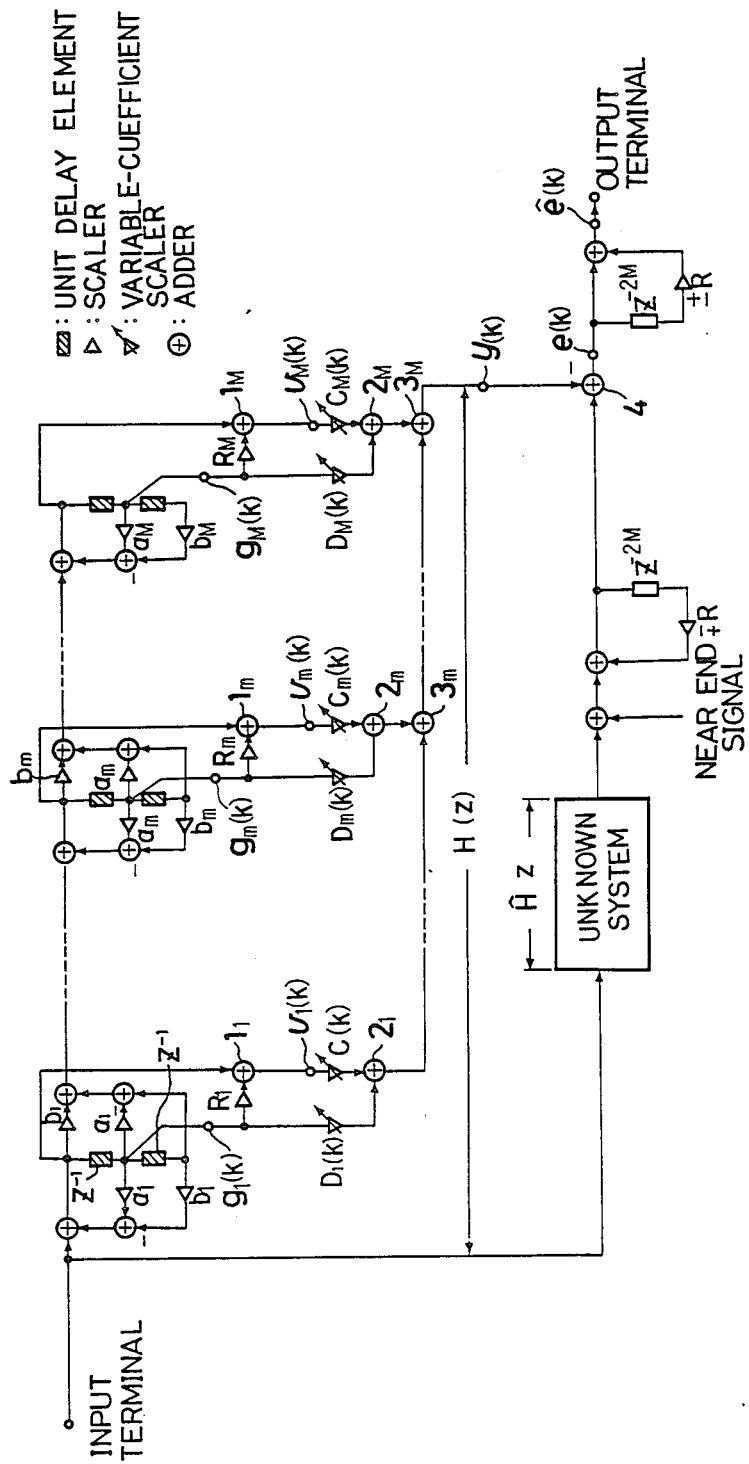
FIGS. 11 and 12 also respectively show echo cancelers of further embodiments of the invention.

A further embodiment of the invention is shown in FIG. 11. This embodiment is an echo canceler having an adaptive digital filter similar to the embodiment of FIG. 9 but also includes a measure providing for the case in which the R in the denominator polynomial $1 \pm Rz^{-2M}$ in Eq. (15) cannot be ignored. The adaptive digital filter with the transfer function H(z) in this figure is identical to the adaptive digital filter in FIG. 6. From Eq. (15) the transfer function H(z) of this adaptive filter is $$H(z) = \frac{N(z)}{1 \pm Rz^{-2M}}$$

Figure 1:
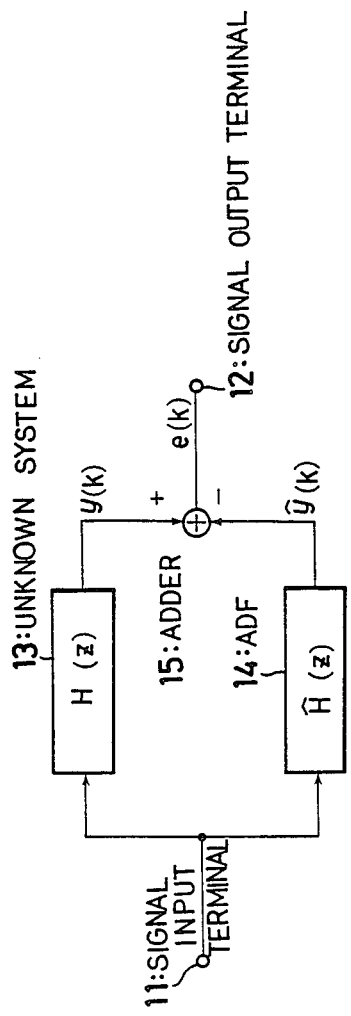
FIG. 1 is a schematic diagram showing indentification of an unknown system by use of an adaptive digital filter.
Figure 2:
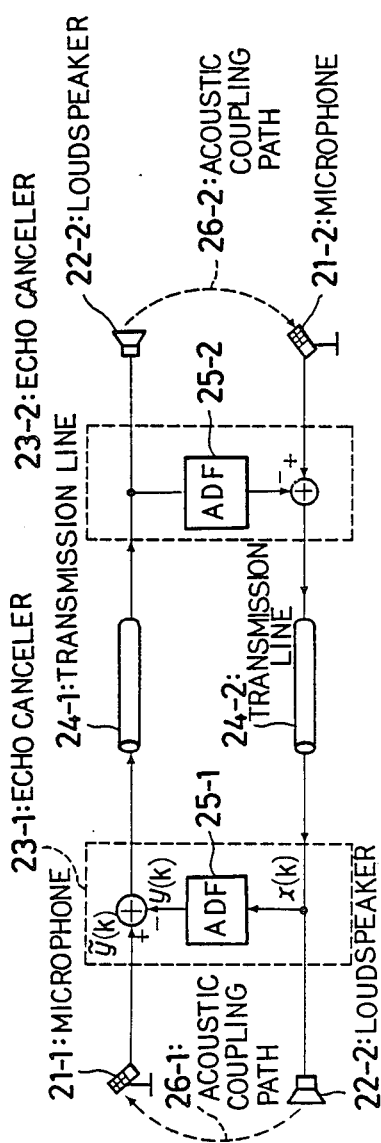
FIG. 2 is a schematic diagram showing a teleconferencing system employing an echo canceler.

A recursive digital filter having a transfer function of $1/(1 \pm Rz^{-2M})$ is inserted in series with the unknown system $\overline{H}(z)$, so:

$$\frac{N(z)}{1 \pm Rz^{-2M}} = \frac{\hat{H}(z)}{1 \pm Rz^{-2M}} \quad (22)$$

from which it follows that $N(z) = \hat{H}(z)$, indicating that $N(z)$ is capable of accurately estimating $\hat{H}(z)$. When the adaptive digital filter in this drawing is used in a bidirectional communication system as in FIG. 2, since a nonrecursive digital filter with the inverse transfer function of $1/(1 \pm Rz^{-2M})$ is connected to the output of the adder 4, the transfer function from the signal input point at the microphone to the output terminal (leading to the communication line) is:

$$\frac{1}{1 \pm Rz^{-2M}} \cdot (1 \pm Rz^{-2M}) = 1 \quad (23)$$

Hence the signal input at the microphone is reproduced at the output terminal.

Let $\hat{E}(z)$ be the z-transform of $e(k)$ in the drawing and let $E(z)$ be the z-transform of $\hat{e}(k)$. Then:

$$E(z) = \frac{\hat{H}(z) - N(z)}{1 \pm Rz^{-2M}} \quad (24)$$

$$\hat{E}(z) = E(z) \cdot (1 + Rz^{-2M}) = \hat{H}(z) - N(z) \quad (25)$$

The error signal $\hat{H}(z) - N(z)$ is produced at the output terminal, but this quantity is not in question because it is the estimation error.

Figure 12:
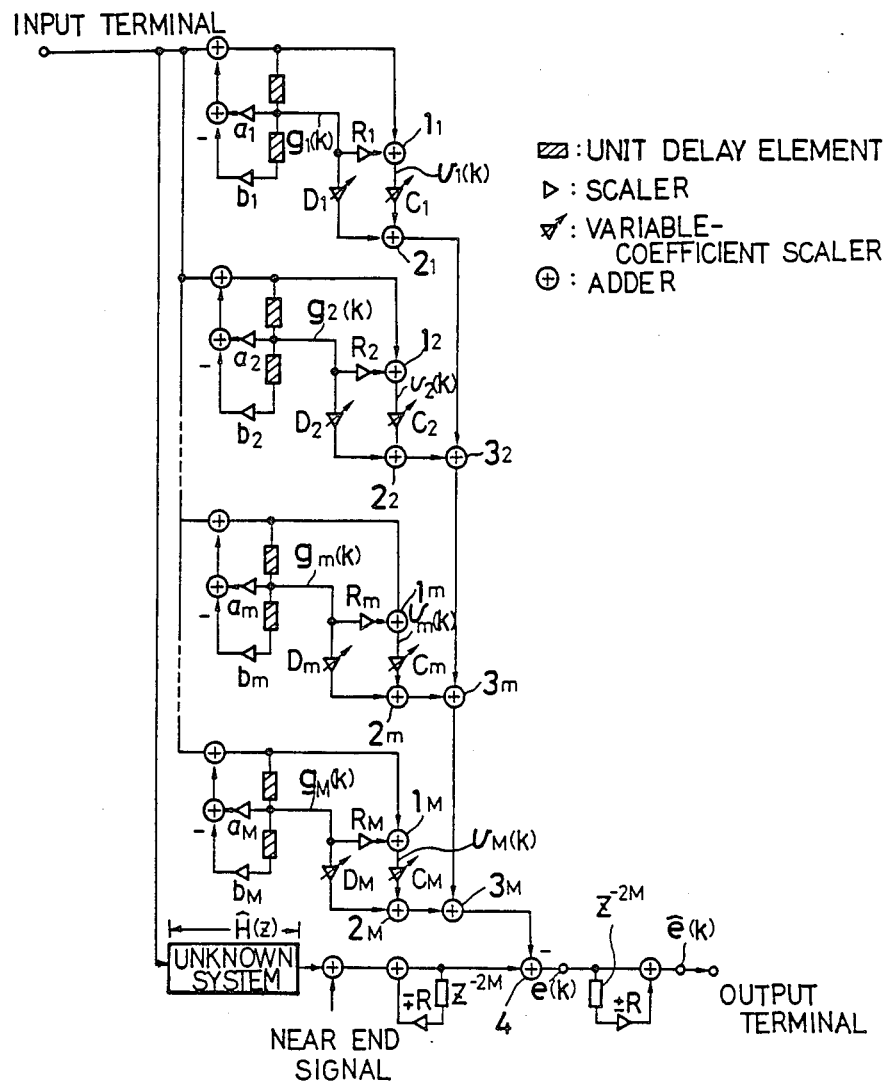

The measure providing for the case in which the R in the denominator polynominal $1 \pm Rz^{-2M}$ in Eq. (15) cannot be ignored, as described in connection with the embodiment of FIG. 11 can be adopted to any of the embodiments of FIGS. 8 to 10 as well. FIG. 12 shows the configuration where such measure is adopted to the embodiment of FIG. 9. The functions are similar to those described in connection with the embodiment of FIG. 11.

As explained above, in this invention the scaler coefficients of the second-order recursive digital filter are selected so that the input signals to the two variable-coefficient multipliers in each basic section are orthogonal when the system input signal is nonwhite, and the variable scaler coefficients are selected so that the mean square values of these signals are all equal.

In addition, the output from the unknown system can be connected to a recursive digital filter, the output from the adaptive digital filter is subtracted from the output of this filter, and the difference signal is fed to a nonrecursive digital filter with a transfer function inverse to that of the recursive filter. The system output is the output of this nonrecursive digital filter. As a result, even for nonwhite signals such as voice signals, the adaptive digital filter system converges rapidly and correctly estimates the unknown system.

If the adaptive digital filter is configured so that the second-order recursive digital filters are connected in parallel, then in addition to the above effects, the configuration can be simplified.

What is claimed is:

1. An adaptive digital filter comprising M basic sections (where M is a positive integer) connected in series, in which each of a first M−1 of said M basic sections comprises a second-order recursive digital filter and a second-order nonrecursive digital filter and an M-th basic section following the first M-1 basic sections comprises a second-order recursive digital filter, wherein the m-th basic section (m=1 to M) comprises a scaler for multiplying a first-order delayed output $g_m(k)$ of this basic section by a coefficient $R_m$, and a first adder for adding an output of this scaler to a 0th-order delayed output signal of this basic section, a first variable-coefficient scaler for multiplying an output $v_m(k)$ of the first adder by a variable coefficient $C_m(k)$, a second variable-coefficient scaler for multiplying the first-order delayed output $g_m(k)$ by a variable coefficient $D_m(k)$, a second adder for adding an output of the first variable-coefficient scaler to an output of the second variable-coefficient scaler, and means for adding together outputs of the second adders of each of the basic sections to create a final output signal of the filter, coefficients $a_m$ and $b_m$ of the second-order recursive digital filter in each basic section being selected so that poles of this filter are located near a unit circle in a z-plane, and the variable coefficients $C_m(k)$ and $D_m(k)$ being selected so that a mean square value of the first-order delayed output $g_m(k)$ and a mean square value of the output $v_m(k)$ of the first adder are equal.

2. An adaptive digital filter comprising M basic sections (where M is a positive integer) connected in series, in which each of a first M-1 of said M basic sections comprises a second-order nonrecursive digital filter and a second-order nonrecursive digital filter and an M-th basic section following the M−1 basic sections comprises a second-order recursive digital filter, wherein the m-th basic section (m=1 to M) comprises a scaler for multiplying a 0th-order delayed output $v_m(k)$ of the basic section by a coefficient $R_m$, a first adder for adding an output of this scaler to a first-order delayed output signal of this basic section, a first variable-coefficient scaler for multiplying an output $g_m(k)$ of the first adder by a variable coefficient $D_m(k)$, a second variable-coefficient scaler for multiplying a 0th-order delayed output $v_m(k)$ by a variable coefficient $C_m(k)$, a second adder for adding an output of the first variable-coefficient scaler to an output of the second variable-coefficient scaler, and means for adding together the outputs of the second adders of each of the basic sections to create a final output signal of the filter, coefficients $a_m$ and $b_m$ of the second-order recursive digital filter in each basic section being selected so that poles of this filter are located near a unit circle in a z-plane, and the variable coefficients $C_m(k)$ and $D_m(k)$ being selected so that a mean square value of the first-order delayed output $g_m(k)$ and a mean square value of the output $v_m(k)$ of the first adder are equal.

3. An adaptive digital filter comprising M second-order recursive digital filters connected in parallel (where M is a positive integer), wherein each second-order recursive digital filter in the adaptive digital filter comprises a scaler for multiplying a first-order delayed output $g_m(k)$ of the second-order recursive digital filter by a coefficient $R_m$, (m=1 to M), a first adder for adding an output of this scaler to a 0th-order delayed output signal, a first variable-coefficient scaler for multiplying an output $v_m(k)$ of the first adder by a variable coefficient $C_m(k)$, a second variable-coefficient scaler for multiplying a first-order delayed output $g_m(k)$ by a variable coefficient $D_m(k)$, a second adder for adding an output of the first variable-coefficient scaler to an output of the second variable-coefficient scaler, and means for adding together the outputs of the second adders of each of the basic sections to create a final output signal of the filter, the coefficients $a_m$ and $b_m$ of the second-order recursive digital filter being selected so that poles of that filter are located near a unit circle centered at the origin in a z-plane, at equally spaced angles about the origin, the variable coefficients $C_m(k)$ and $D_m(k)$ being selected so that a mean square value of the first-order delayed output $g_m(k)$ and a mean square value of the output $v_m(k)$ of the first adder are equal.

4. An adaptive digital filter comprising M second-order recursive digital filters connected in parallel (where M is a positive integer), wherein each second-order recursive digital filter is the adaptive digital filter comprises a scaler for multiplying a 0th-order delayed output $v_m(k)$ of this second-order recursive digital filter by a coefficient $R_m$, a first adder for adding an output of this scaler to a first-order delayed output signal, a first variable-coefficient scaler for multiplying an output $g_m(k)$ of the first adder by a variable coefficient $D_m(k)$, a second variable-coefficient scaler for multiplying the 0th-order delayed output $v_m(k)$ by a variable coefficients $C_m(k)$, a second adder for adding an output of the first variable-coefficient scaler to an output of the second variable-coefficient scaler, and means for adding together the outputs of the second adders of each of the basic sections to create the final output signal of the filter, the coefficients $a_m$ and $b_m$ of the second-order recursive digital filter being selected so that poles of that filter are located near a unit circle centered at the origin in a z-plane, at equally spaced angles about the origin, the variable coefficients $C_m(k)$ and $D_m(k)$ being selected so that a mean square value of the first-order delayed output $g_m(k)$ and a mean square value of the output $v_m(k)$ of the first adder are equal.

5. An echo canceler in which an output from an unknown system is connected to a recursive digital filter, an output of an adaptive digital filter that estimates the output of the unknown system is subtracted from the output of the recursive digital filter to obtain a difference signal, the difference signal is fed to a nonrecursive digital filter having a transfer function inverse to a transfer function of the recursive digital filter, and an output of the nonrecursive digital filter is an output of the echo canceler, wherein the adaptive digital filter in this echo canceler comprises M basic sections enumerated 1 to M connected in series, each basic section comprising a second-order recursive digital filter and a second-order nonrecursive digital filter connected in series and a first-order nonrecursive digital filter connected in series with them, outputs of the first-order nonrecursive digital filters in the basic sections being added in succession to create the output signal of the adaptive digital filter, scaler coefficients $a_m$ and $b_m$ of the second-order recursive digital filter in the m-th basic section (m=1 to M) being selected so that poles of that filter are located near a unit circle in a z-plane, variable scaler coefficients $C_m$ and $D_m$ of variable-coefficient scalers in the first-order nonrecursive digital filter being selected so that mean square values of input signals to the basic sections are equal.

6. An echo canceler in which an output from an unknown system is connected to a recursive digital filter, an output of an adaptive digital filter that estimates the output of the unknown system is subtracted from the output of the recursive digital filter to obtain a difference signal, the difference signal is fed to a nonrecursive digital filter having a transfer function inverse to a transfer function of the recursive digital filter, and an output of the nonrecursive digital filter is an output of the echo canceler, wherein the adaptive digital filter in this echo canceler comprises M basic sections enumerated 1 to M connected in parallel, each basic section comprising a second-order recursive digital filter and a first-order nonrecursive digital filter connected to it, and means for adding together outputs of the first-order nonrecursive digital filters in succession to create an overall output of the adaptive digital filter, scaler coefficients $a_m$ and $b_m$ of the second-order recursive digital filter in the m-th basic section (m=1 to M) being selected so that poles of that filter are located near a unit circle centered at the origin in a z-plane, at equally spaced angles about the origin, variable scaler coefficients $C_m$ and $D_m$ of variable-coefficient scalers in the first-order nonrecursive digital filter being selected so that mean square values of input signals to the basic sections are equal.

* * * * *